US006188298B1

(12) United States Patent
Hopkinson et al.

(10) Patent No.: US 6,188,298 B1
(45) Date of Patent: Feb. 13, 2001

(54) WINDING TRANSIENT SUPPRESSION TECHNIQUE

(75) Inventors: Philip J. Hopkinson, Charlotte, NC (US); David L. Swindler, Murfreesboro, TN (US)

(73) Assignee: Square D Company, Palatine, IL (US)

( * ) Notice: Under 35 U.S.C. 154(b), the term of this patent shall be extended for 0 days.

(21) Appl. No.: 09/223,051

(22) Filed: Dec. 30, 1998

(51) Int. Cl.$^7$ ....................................................... H03H 7/06

(52) U.S. Cl. .......................... 333/172; 333/177; 333/185; 336/70

(58) Field of Search .................................... 333/172, 177, 333/181, 185; 336/70; 361/38; 338/267, 270, 297, 298, 299, 300, 301; 29/618, 620

(56) References Cited

U.S. PATENT DOCUMENTS

| | | | | |
|---|---|---|---|---|
| 1,037,683 | * | 9/1912 | Sumner | 29/620 X |
| 3,146,417 | | 8/1964 | Pearson | 336/69 |
| 3,378,805 | * | 4/1968 | Jones | 338/300 |
| 3,982,814 | * | 9/1976 | Kaiserswerth et al. | 333/181 X |
| 4,072,921 | * | 2/1978 | Sacchetti | 338/61 |
| 4,090,227 | | 5/1978 | Schweitzer | 361/57 |
| 4,153,891 | | 5/1979 | McNutt | 336/70 |
| 4,334,254 | | 6/1982 | Baker et al. | 361/9 |
| 4,760,486 | | 7/1988 | Beeken et al. | 361/56 |
| 5,005,100 | | 4/1991 | Owen | 361/35 |
| 5,130,880 | | 7/1992 | Puri | 361/35 |
| 5,216,356 | | 6/1993 | Owen | 323/361 |
| 5,323,304 | | 6/1994 | Woodworth | 363/47 |
| 5,739,723 | * | 4/1998 | Kit | 333/172 |
| 5,764,123 | | 6/1998 | Waters | 336/84 R |
| 5,770,992 | | 6/1998 | Waters | 336/84 R |

FOREIGN PATENT DOCUMENTS 60-38910 * 2/1985 (JP) ...................................... 333/181

OTHER PUBLICATIONS

Hart, "Power Filter Configuration", IBM Technical Disclosure Bulletin, vol. 19, No. 7, Dec. 1976.*

*Electrical Transients in Power Systems;* Second Edition; Allan Greenwood; Rensselaer Polytechnic Institute; "Modeling Power Apparatus and the Behavior of such Equipment under Transient Conditions"—pp. 322–384, 1991.

*Transformer Engineering;* A Treatise on the Theory, Operation, and Application of Transformers; The late L.F. Blume, A. Boyajian, G. Camilli, T.C. Lennox, S. Minneci, V.M. Montsinger; All of the Engineering Division of the General Electric Company, Pittsfield, Massachusetts; Second Edition; "Transient Voltage Characteristics of Transformers"; pp. 463–500, 1951.

* cited by examiner

*Primary Examiner*—Justin P. Bettendorf
(74) *Attorney, Agent, or Firm*—Michael J. Femal; Larry I. Golden

(57) ABSTRACT

The present invention relates to a transformer having a conductive element spiraling along the length of an insulated wire of the coil. When formed into plurality of adjacent turns, the conductive element couples one of the plurality of turns with another of the plurality of turns. The conductive element increases the series capacitance of the transformer circuit. A resistive element may also spiral along the length of the insulated wire to couple one of the plurality of turns with another of the plurality of turns. The resistive element not only increases the series capacitance of the transformer, but also increases the series conductance of the transformer circuit. The increase in the series resistance increases the dampening of the switching resonance.

20 Claims, 1 Drawing Sheet

WINDING TRANSIENT SUPPRESSION TECHNIQUE

TECHNICAL FIELD

The present invention relates generally to the protection of transformers. More particularly, the present invention relates to the protection of transformers in which voltage transients, such as voltage surges created when switching the transformer on and off, are dampened so that the transients do not damage the transformer.

BACKGROUND OF THE INVENTION

Power transformers and other wire-wound devices have been known to fail by a phenomena called “switching resonance.” For example, a circuit breaker connecting a power transformer to a power source may go through a state known as multiple re-ignitions as the power transformer is switched on or off. The multiple re-ignitions may last for less than 10 microseconds. During this short period of time, the re-ignition rate of the circuit breaker may be on the order of 10 to 10,000 kilohertz. The rapid re-ignitions cause the coils of the transformer to develop resonance at these frequencies. At these very high frequencies, very high voltages can be induced between the turns of the transformer coils. The large voltages can arise when some type of switching occurs in the network.

One method used to prevent the harmonic effects of voltage transients is to attempt to restrict harmonic currents by the use of low pass filters or high frequency traps. These filters are configured to become increasingly conductive as frequency increases. They shunt high frequency disturbances to ground and dissipate the energy. Further, the switching resonance problem typically occurs deep in the center of the windings where normal means of over-voltage suppression become very difficult and impractical. Although the use of external RC networks have been successfully used to control these events, these devices require a significant economic investment.

Various electrostatic shielding techniques have also been used to control the magnitude of internal voltage oscillations. The shielding consists of a metal foil, and is heavily insulated from the coil and from surrounding structural parts at ground potential. The shielding is electrically connected to the line terminal of the coil. The electrostatic shield adds series capacitance to the circuit, thus minimizing the magnitude of the high frequency oscillations. The resonance of the oscillations, however, is not dampened by the electrostatic shield. In addition, although the electrostatic shield adds series capacitance to the outer layer of turns, no series capacitance is directly added to the inner layers of turns.

SUMMARY OF THE INVENTION

The present invention is directed to a transformer comprising a coil and a conductive element. The coil has a length of insulated wire formed into plurality of adjacent turns. The conductive element spirals around the length of the insulated wire and couples one of the plurality of turns with another of the plurality of turns. The conductive element adds series capacitance to the transformer circuit, thereby minimizing the magnitude of the high frequency oscillations.

DETAILED DESCRIPTION

Figure 1:
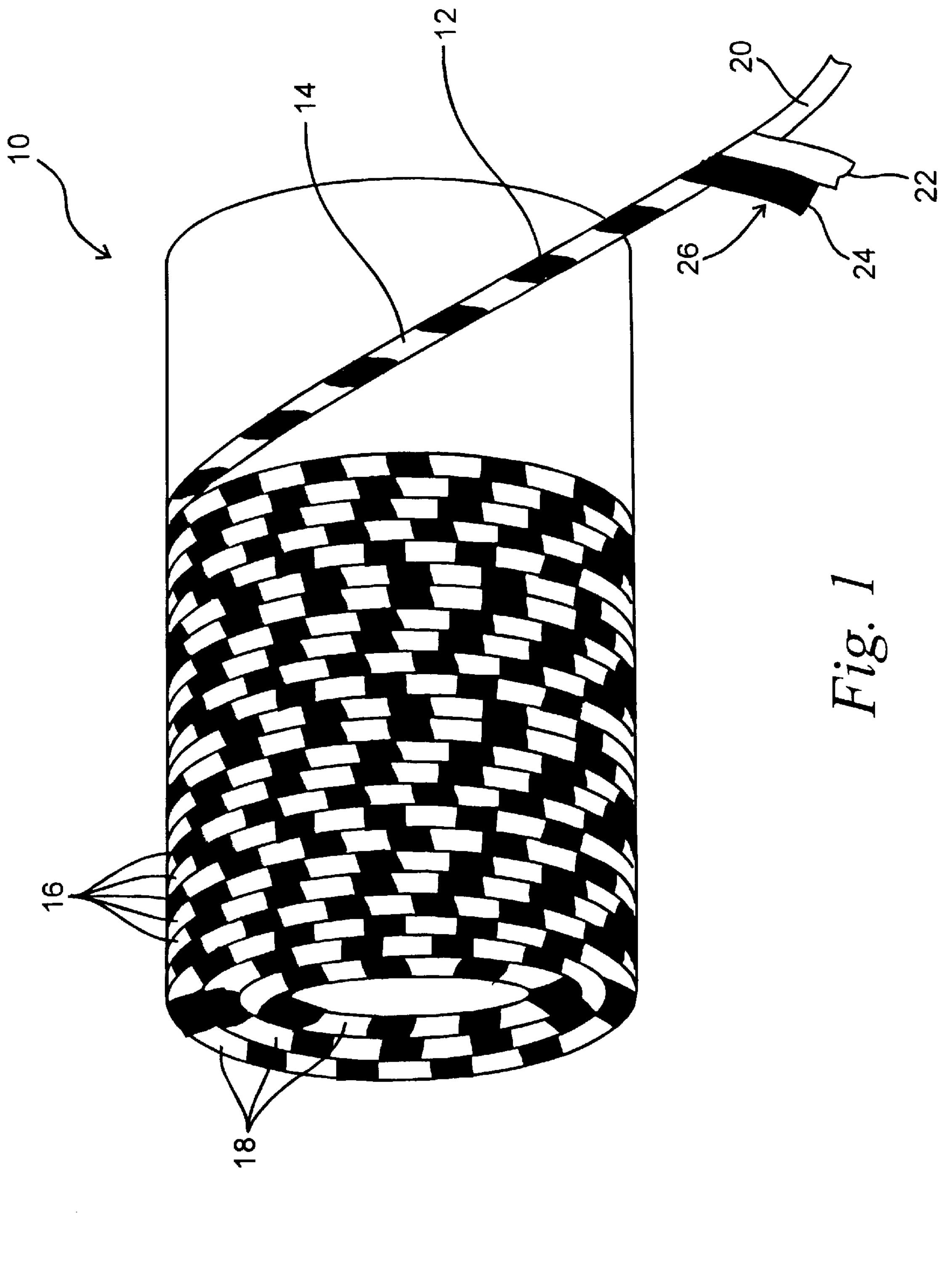
FIG. 1 is a perspective view showing the formation of a coil for a transformer in accordance with the present invention.

While this invention is susceptible of embodiment in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

Conventional transformers comprise a primary coil and at least one secondary coil. Current through the primary coil produces a magnetic field which induces a voltage across the secondary coil. Both the primary and secondary coils have a length of insulated wire formed into plurality of adjacent turns defining a layer. As is well known, many layers of adjacent turns separated by insulation typically form the coils.

A coil 10 of a transformer in accordance with the present invention is shown in FIG. 1. A resistive element 12 extends along the length of an insulated wire 14 of the coil 10, and spirals around the insulated wire 14. The resistive element 12 has a resistance between adjacent turns 16 from 10 ohms to 1000 ohms. Preferably, the resistive element 12 comprises a semi-conductive paint. In particular, the semi-conductive paint comprises carbon black or metal oxide. The resistive element 12 is of a thickness sufficient to ensure one of a plurality of turns 16 is coupled with another of the plurality of turns 16 of a same layer 18.

The insulated wire 14 to be wound into the coil 10 is formal is insulated by winding an insulating tape 22 over the surface of a wire 20. The resistive element 12 can be applied directly to the insulating tape 22. The tape 22 is preferably an inch wide, and is wrapped around the wire 20 with a high pitch so that in one turn about the wire 20, the tape 22 becomes half lapped. Thus, in most areas over the wire surface, there are two thicknesses of tape 22 except for a small gap where there would only be a single layer of tape 22. When the insulated wire 14 is wound into a coil 10, there are between two and four layers of insulation between adjacent turns 16 of the wire 14.

The resistive element 12 is placed on the insulating tape 22 prior to wrapping the wire 20 with the tape 22. Specifically, the resistive element 12 is a semi-conducting coating painted along the length of the insulating tape 22. The resistive element 12 could cover a portion of one surface of the insulating tape 22, or it could cover the entire surface of the insulating tape 22. Preferably, the resistive element 12 is painted as a stripe 24 running longitudinally along the length of the tape 22. The stripe 24 is placed along the edge 24 of the tape 22 so that as it is wound around the wire 20, the resistive element 12 presents itself only on the outer surface of the insulated wire 14. Thus, there would be no resistive element 12 in contact with the wire 20, nor would there be any resistive element 12 between the insulation layers.

As the insulated wire 14 is wound into a coil 10, the resistive element 12 of one turn 16 of the insulated wire 14 will come in contact with the resistive element 12 of an adjacent turn 16 of the coil 10 and form an electrical connection between the outer surfaces of the insulated wires 14. A small continuous RC network is thus formed between each turn in the coil 10. Specifically, the wire 14 of one turn 16 forms a plate of a first capacitor, the insulating material of that turn 16 forms the dielectric for the first capacitor, and the resistive element 12 on the surface of that turn 16 becomes the second plate of the first capacitor. The resistive element 12 also forms a resistor. The resistive element 12 on the surface of an adjacent turn 16 forms a second resistor connected in series. The resistive element 12 of the adjacent turn 16 also forms the first plate for a second capacitor with the insulating material and the wire 20 of the second turn 16 forming the dielectric and the second plate of the second capacitor, respectively. The electrical equivalent of this circuit would be a capacitor, two resistors and a second capacitor all in series between all turns 16 of the coil 10. Accordingly, the resistive element 12 not only increases the series capacitance of the transformer circuit, but also increases the series conductance of the transformer circuit across the layer 18 of the transformer winding. The increase in the series conductance increases the dampening of the switching resonance. A conductive element 12 may also be used in the present invention to add series capacitance without adding series resistance to the transformer circuit.

Not only can RC network currents flow perpendicularly through the resistive element 12, as described above, but current also flows longitudinally along the length of the wire 14. Also, the resistive element 12 can more evenly distribute dielectric stress within the insulating material. Abrupt changes in dielectric materials having differing dielectric constants can have an adverse effect on the dielectric materials in contact with each other as a result of high dielectric stress levels. The resistive elements 12 will distribute any concentrated stress levels which may develop in the winding process.

At power frequencies, the current flow in any direction through the resistive element 12 would be small because of the relatively high capacitive reactance across the dielectric of the insulation material. At high frequencies, however, the capacitive reactance, or impedance, of the insulation material becomes low and the resistive element 12 becomes connected to each wire 14. This causes the energy of the transient to be absorbed by the resistive element 12 which transforms the energy into heat which is dissipated over time. This energy dissipation dampens the resonant activity of the coil 10 preventing high voltages between turns. Thus, the transformer is self-protecting.

While the specific embodiments have been illustrated and described, numerous modifications come to mind without significantly departing from the spirit of the invention and the scope of protection is only limited by the scope of the accompanying claims.

We claim:

1. A transformer comprising:

a coil having a length of insulated wire formed into a plurality of adjacent turns defining a winding layer, the insulated wire including a wire conductor wrapped with an insulating tape;

a resistive element extending along the length of the insulated wire coupling one of the plurality of turns with another of the plurality of turns;

wherein the resistive element increases series capacitance of the transformer across the layer; and wherein the insulated wire coupling one of the plurality of turns with another of the plurality of turns forms an internal series resistor-capacitor network to suppress induced transient voltages within the coil.

2. The transformer of claim 1 wherein said resistive element spirals around the length of insulated wire.

3. The transformer of claim 1 wherein said coil is a primary coil of the transformer.

4. The transformer of claim 1 wherein said coil is a secondary coil of the transformer.

5. The transformer of claim 1 wherein said resistive element comprises a semi-conductive coating applied along a length of the insulating tape.

6. The transformer of claim 1 wherein said resistive element comprises carbon black.

7. The transformer of claim 1 wherein said resistive element comprises metal oxide.

8. The transformer of claim 1 wherein the resistive element has a resistance between adjacent turns from 10 ohms to 1000 ohms.

9. A transformer comprising:

a coil having a length of insulated wire formed into a plurality of adjacent turns defining a winding layer, the insulated wire including a wire conductor wrapped with an insulating tape;

a conductive element extending along the length of the insulated wire coupling one of the plurality of turns with another of the plurality of turns;

wherein the conductive element increases series capacitance of the transformer across the layer; and wherein the insulated wire coupling one of the plurality of turns with another of the plurality of turns forms an internal series resistor-capacitor network to suppress induced transient voltages within the coil.

10. The transformer of claim 9 wherein said conductive element spirals around the length of insulated wire.

11. The transformer of claim 1 wherein said coil is a primary coil of the transformer.

12. The transformer of claim 1 wherein said is a secondary coil of the transformer.

13. The transformer of claim 1 wherein said resistive element comprises a coating applied along a length of the insulating tape.

14. The transformer of claim 9 wherein said conductive element comprises carbon black.

15. The transformer of claim 9 wherein said conductive element comprises metal oxide.

16. A method of making a coil of a transformer comprising the steps of:

applying a resistive element along the length of an insulating tape, wherein the resistive element comprises a stipe longitudinally along the length of the tape;

wrapping the tape in a spiral around a wire;

forming the wire into a plurality of adjacent turns and forming the plurality of adjacent turns into a coil of the transformer.

17. The method of claim 16 wherein the resistive element comprises carbon black.

18. The method of claim 16 wherein the resistive element comprises metal oxide.

19. The method of claim 16 wherein the resistive element has a resistance between adjacent turns from 10 ohms to 1000 ohms.

20. A transformer comprising:

a coil having a length of insulated wire formed into a plurality of adjacent turns defining a winding layer, the insulated wire including a wire conductor wrapped with an insulating tape;

a resistive element extending along the length of the insulated wire coupling one of the plurality of turns with another of the plurality of turns;

wherein the resistive element spirals around the length of insulated wire; and wherein the insulated wire coupling one of the plurality of turns with another of the plurality of turns forms an internal series resistor-capacitor network to suppress induced transient voltages within the coil.

* * * * *